United States Patent [19]
Itagaki et al.

[11] Patent Number: 5,465,719
[45] Date of Patent: Nov. 14, 1995

[54] NUCLEAR MAGENTIC RESONANCE IMAGING APPARATUS

[75] Inventors: Hiroyuki Itagaki; Yo Taniguchi, both of Kokubunji; Hidemi Shiono, Akigawa; Kenji Takiguchi, Kashiwa; Etsuji Yamamoto, Akishima, all of Japan

[73] Assignee: Hitachi, Ltd., Tokyo, Japan

[21] Appl. No.: 98,775

[22] Filed: Jul. 29, 1993

[30] Foreign Application Priority Data

Aug. 6, 1992 [JP] Japan ................... 4-210065

[51] Int. Cl.⁶ .................................. A61B 5/055
[52] U.S. Cl. .................. 128/653.5; 324/318; 335/299
[58] Field of Search ............... 128/653.2, 653.5; 324/309, 318, 319, 322; 335/216, 296, 299

[56] References Cited

U.S. PATENT DOCUMENTS

| | | | |
|---|---|---|---|
| 4,897,604 | 1/1990 | Carlson et al. | 324/318 |
| 4,943,775 | 7/1990 | Boskamp et al. | 324/318 |
| 4,959,613 | 9/1990 | Yamamoto et al. | 324/318 |
| 5,256,969 | 10/1993 | Miyajima et al. | 324/318 |
| 5,285,160 | 2/1994 | Loos et al. | 324/318 |
| 5,311,134 | 5/1994 | Yamagata et al. | 324/318 |

FOREIGN PATENT DOCUMENTS

| | | |
|---|---|---|
| 59-32855 | 2/1984 | Japan . |
| 63-19138 | 1/1988 | Japan . |
| 63-501336 | 5/1988 | Japan . |
| 2-1238 | 1/1990 | Japan . |
| 3-36606 U | 4/1991 | Japan . |

Primary Examiner—Krista M. Zele
Attorney, Agent, or Firm—Antonelli, Terry, Stout & Kraus

[57] ABSTRACT

A bobbin for holding a gradient magnetic field coil, having a changeable size and sectional shape (a separable bobbin) is constituted by assembling coil supporters (a bobbin divided into a plurality of segments). The separable bobbin has coil supporters of an upper part a bottom part and a set of side surface parts and at least two supporting rods made of a nonmagnetic substance are fitted to the side surface parts of the coil supporters. Holes permitting the insertion of the supporting rods are bored in the upper and bottom parts of the coil supporters. The length d1 between both side surface parts can be made variable by adjusting the insertion length of the supporting rod into the upper and bottom parts. Accordingly, the distance between a patient and a gradient magnetic field can be reduced, and an intended gradient magnetic field intensity can be generated by a smaller current producing the gradient magnetic field than in the prior art. Setting of the patient to an MRI imaging apparatus becomes also easier, and there can be obtained a gradient magnetic field coil capable of being easily fitted and removed to and from the MRI imaging apparatus.

13 Claims, 8 Drawing Sheets

ENTRANCE/EXIT DIRECTION

5,465,719

NUCLEAR MAGENTIC RESONANCE IMAGING APPARATUS

BACKGROUND OF THE INVENTION

This invention relates to gradient magnetic field coils used for a nuclear magnetic resonance imaging apparatus (hereinafter referred to as the "MRI imaging apparatus") and a bobbin for holding the gradient magnetic field coils. More specifically, the present invention relates to gradient magnetic field coils which allow easy setting of a patient to the MRI apparatus, and can be fitted and removed easily to and from the MRI imaging apparatus, and the structure of a bobbin of the gradient magnetic field coil.

A technology of obtaining a tomographic image of an inspection object such as proton density imaging by utilizing nuclear magnetic resonance has been developed in the past. To speed up the imaging operation of the tomographic image or to obtain higher resolution according to this prior art technology, it has been a customary practice to reduce the distance between the gradient magnetic field coils and the patient and to apply a larage current of at most hundreds of amperes to the gradient magnetic fields because strong gradient magnetic fields must be applied to the object of imaging.

When a current flows through a gradient magnetic field coil, the gradient magnetic field coil receives a Lorentz force from a static magnetic field and undergoes vibration. Since a bobbin for holding the gradient magnetic field coil holds the coil in such a manner as to suppress this vibration, it is strongly produced and its weight tends to increase, so that mounting and removal of the bobbin to and from the MRI imaging apparatus has become more difficult. For this reason, the gradient magnetic field coil produced under a predetermined condition is held by the bobbin add under such a state, is fixedly mounted to the MRI imaging apparatus in many cases.

The prior art technologies related with the present inventioin are as follows. First, a method of reducing the distance between the gradient magnetic field coil and the patient by dividedly using a bobbin for holding the gradient magnetic field coil for each imaging portion of the subject while keeping the size of the bobbin unaltered is described in (a) JP-A-2-1238 and (b) JP-U-3-36606. The method of (a) JP-A-2-1238 sets at least one gradient magnetic field coil closer to the body of the patient, applies a predetermined current to a gradient magnetic field coil set and generates a stronger gradient magnetic field inside the body of the patient. The method of (b) JP-U-3-36606 mounts the gradient magnetic field coil to an air bag, introduces or evacuates compressed air into and from this air bag and thus fits and removes the gradient magnetic field coil to and from the MRI imaging apparatus.

A method which makes the size and shape of the radio-frequency magnetic field coil changeable in accordance with the physical features of the patient is described in (c) JP-A-59-32855 and (d) JP-A-63-501336 (PCT). The bobbin of the radio-frequency magnetic field coil is smaller in size and lighter in weight than the bobbin of the gradient magnetic field coil, and can be fitted and removed more easily. For the field intensity generated by the radio-frequency magnetic field is from several μT to dozens of μT which is about 1/10,000 of the field intensity generated by the gradient magnetic field during high speed imaging, and a large current need not be caused to flow through the radio-frequency magnetic field coil.

SUMMARY OF THE INVENTION

The method of the prior art reference (a) is not free from the problems that the size of the gradient magnetic field coil is unchangeable, the coil set exists in the vicinity of the patient and setting of the patient to the MRI imaging apparatus is difficult. Although the coil set can be fitted and removed easily to and from MRI imaging apparatus according to the prior art method (b), there remains the problem that when the imaging portion of the patient is changed, the distance between the patient and the gradient magnetic field coil becomes great and the intensity of the gradient magnetic field generated inside the body of the patient drops. When the size of the gradient magnetic field coil is unchangeable, a plurality of coil sets are first prepared, and a coil set suitable for the size of the imaging portion of the patient is selectively used so as to prevent the drop of the magnetic field intensity generated inside the body of the patient.

As described above, the prior art methods (a) and (b) involve the problem that the patient cannot be easily inserted into the bobbin for holding the gradient magnetic field coil and then set to the MRI imaging apparatus. In addition, the coil set must be changed in accordance with the imaging portion of the patient.

Whereas the gradient magnetic field coil switches the gradient magnetic field of some hundreds of Hz, the radio-frequency magnetic field coil handles a radio-frequency magnetic field in the range of about 800 KHz to about 170 MHz. Even when wire materials must be cut with division of the bobbin of the radio-frequency magnetic coil, electric connection can be established by capacitance coupling between the wire materials by utilizing the frequency characteristics in the radio-frequency range. As described above, the properties of the radio-frequency magnetic field are remarkably different from those of the gradient magnetic field, and division of the bobbin of the radio-frequency magnetic field coil cannot be regarded in the same light as division of the bobbin of the gradient magnetic field coil. The drop of the strength might occur with the division of the bobbin, and no reference has described the division of the bobbin of the gradient magnetic field coil.

It is therefore an object of the present invention to provide an MRI imaging apparatus which solves the problems with the prior art described above, permits easy setting of the patient to the MRI imaging apparatus and can easily fit and remove the gradient magnetic field to and from the MRI imaging apparatus.

To accomplish the object described above, the present invention makes the size and shape of the bobbin for holding the gradient magnetic field coil changeable, divides the gradient magnetic field coil set into a plurality of components, and assembles the coil set with the size and shape of the bobbin being changeable.

In other words, each of the divided gradient magnetic field coils is supported by a coil supporter and constitutes a coil set component, and at least a part of a plurality of these coil set components is combined with others to form a separable coil set. At least a part of the coil set component is either fixed to, or stored in, a bed so that this coil set component can be changed in accordance with the imaging portion of the patient. At least a part of the coil supporter opposing the bed is transparent or cut off so as to define an opening in the bobbin.

Further, the shape of the bobbin is shaped asymmetrically with respect to the center of the gradient magnetic field, and means for detecting the bobbin shape and determining the imaging condition of the inspection object is provided so as to correct an image distortion resulting from non-linearity of the gradient magnetic field coil.

The gradient magnetic field coil and the bobbin for holding the gradient magnetic field coil are divided into a plurality of coils and a plurality of coil supporters, respectively, and are assembled so as to make the shape of the separable bobbin changeable. In this way, the patient can be set easily into the gradient magnetic field coil. In other words, when the patient is set, the sectional area of the bobbin for holding the gradient magnetic field coil is increased to a sectional area greater than the sectional area at the time of imaging, and the patient can thus enter more easily into the bobbin. After the patient is set into the coil set, the size and shape of the bobbin are changed. Accordingly, the distance between the gradient magnetic field coil and the patient can be reduced, and setting of the patient to the MRI imaging apparatus becomes easier.

Since the separable coil set is constituted by combining and assembling a plurality of coil set components, the separable coil sets having various sizes can be accomplished by suitable combinations of the coil set components. In this way, the trouble of fitting and removing the gradient magnetic field coil as a whole to and from the MRI imaging apparatus in accordance with the imaging portion of the patient can be eliminated. When the gradient magnetic field coil is fitted and removed, too, the bobbin having a large weight is divided into a plurality of segments and can be fitted and removed in a component unit. Furthermore, the size of the gradient magnetic field coil can be finely adjusted in accordance with the physical features of the patient. Since the bobbin is provided with the opening, the patient can be set to the bed through this opening and does not feel a sense of oppression on the bed.

DESCRIPTION OF THE PREFERRED EMBODIMENTS

Hereinafter, preferred embodiments of the present invention will be described in detail with reference to the accompanying drawings.

Figure 14:
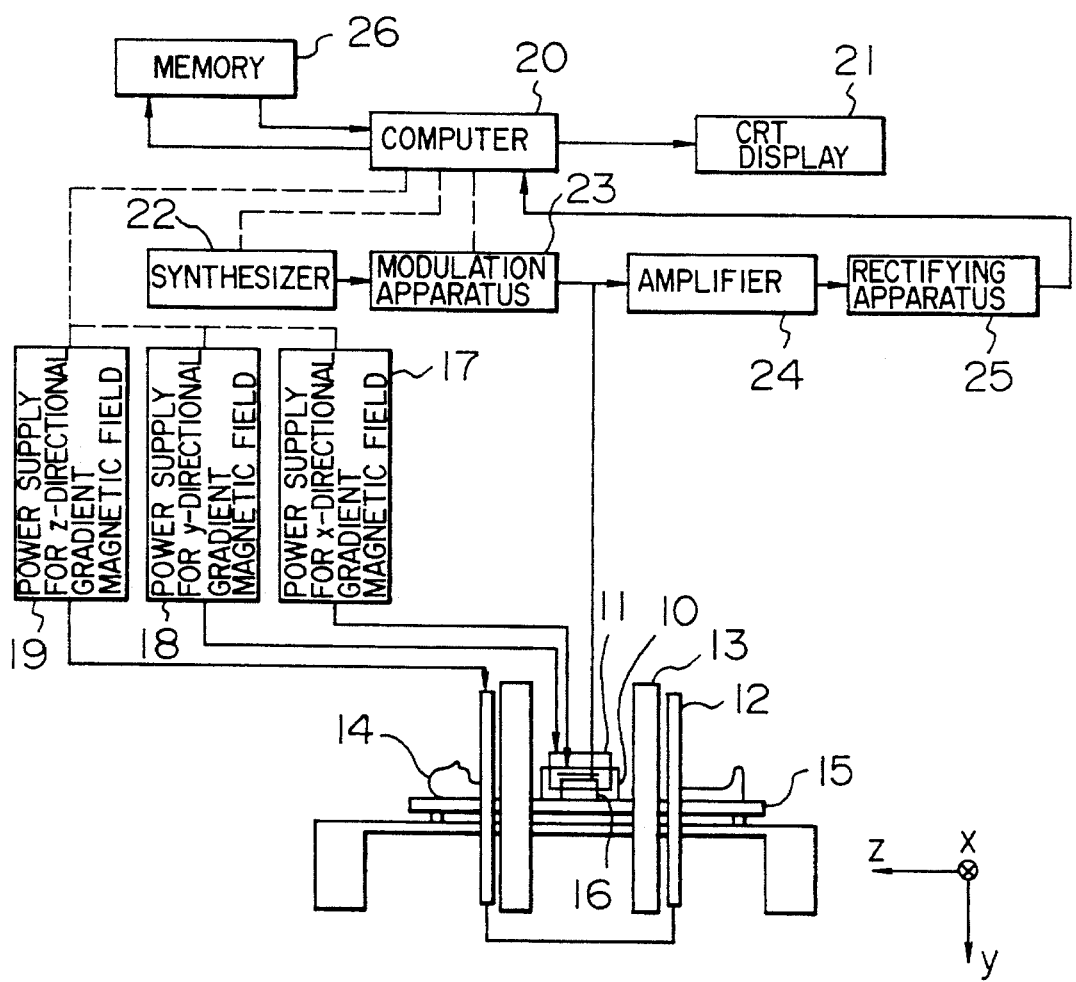
FIG. 14 is a block diagram showing the construction of a nuclear magnetic resonance imaging apparatus to which the present invention is applied.

FIG. 14 is a schematic structural view of an imaging apparatus to which the present invention is applied.

In the drawing, reference numeral 13 denotes a magnet for generating a static magnetic field $H_0$; 14 is an inspection object such as a patient; 15 is a bed on which the patient lies down; 16 is a coil for generating a radio-frequency magnetic field and detecting a signal generated from the inspection object 14; and 10, 11 and 12 are X-, Y- and Z-directional gradient magnetic field coils for generating gradient magnetic fields in X-, Y- and Z-directions, respectively. Reference numerals 17, 18 and 19 denote coil drivers for supplying currents to the gradient magnetic field coils 7, 8, 9, respectively. Reference numeral 20 denotes a computer for computing measured data and reference numeral 21 does a CRT display for displaying the computation result by the computer 20. In FIG. 14, the moving direction of the bed 15 exists in the Z-direction.

Next, the operation of this imaging apparatus will be explained generally.

A radio-frequency magnetic field $H_1$ for exciting a nuclear spin of the inspection object 14 is generated by waveform-shaping and power-amplifying a radio frequency, generated by a synthesizer 22, by a modulator 23 and supplying a current to the coil 16. The signal from the inspection object 14 is received by the coil 16, is amplified by an amplifier 24, is then detected by a detector 25 and is thereafter inputted to a computer 20. After computation, the computer 20 displays the computation result on a CRT display 21. Reference numeral 26 denotes a memory for storing data during computation or final data.

In such an apparatus, an embodiment of the gradient magnetic field coil according to the present invention will be explained hereinafter.

Figure 1:
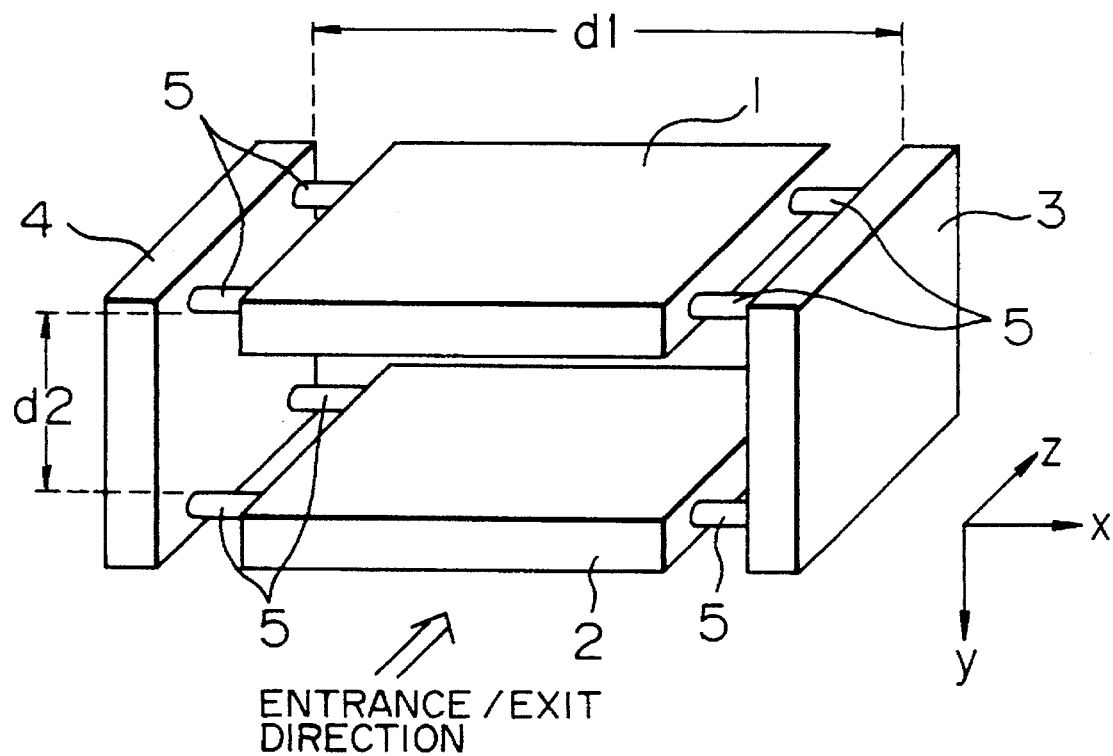
FIG. 1 is a schematic view showing the structure of a separable bobbin capable of changing its size and shape according to the present invention.

FIG. 1 shows the structure where a bobbin (separable bobbin) for supporting a gradient magnetic field coil having a changeable size and shape is constituted by combining bobbins divided into a plurality of segments (coil supporters). The separable bobbin comprises an upper part of coil supporter 1, a bottom part of the coil supporter 2 and a set of side surface parts of the coil supporters 3, 4. At least two supporting rods 5 made of a nonmagnetic substance are fitted to each of the side surface parts 3, 4 among the coil supporters constituting the separable bobbin, and holes having a size permitting the insertion of the supporting rod 5 are bored in each of the upper and bottom parts of the coil supporters. The length d1 between both side surface parts 3, 4 can be made variable by adjusting the insertion length of the supporting rods 5 into the upper part 1 and the bottom part 2 of the coil supporters.

Figure 2A:
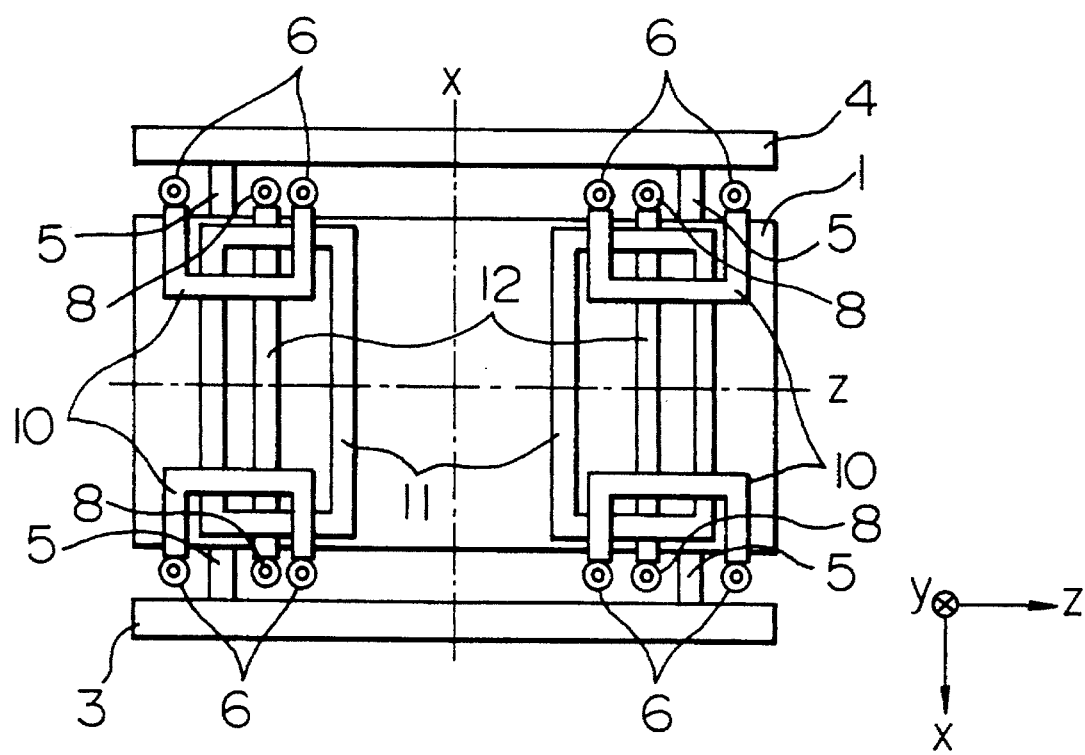
FIGS. 2A and 2B are a plan view and a front view each showing a coupling state of coil wire materials in the separable bobbin according to the present invention.
Figure 2B:
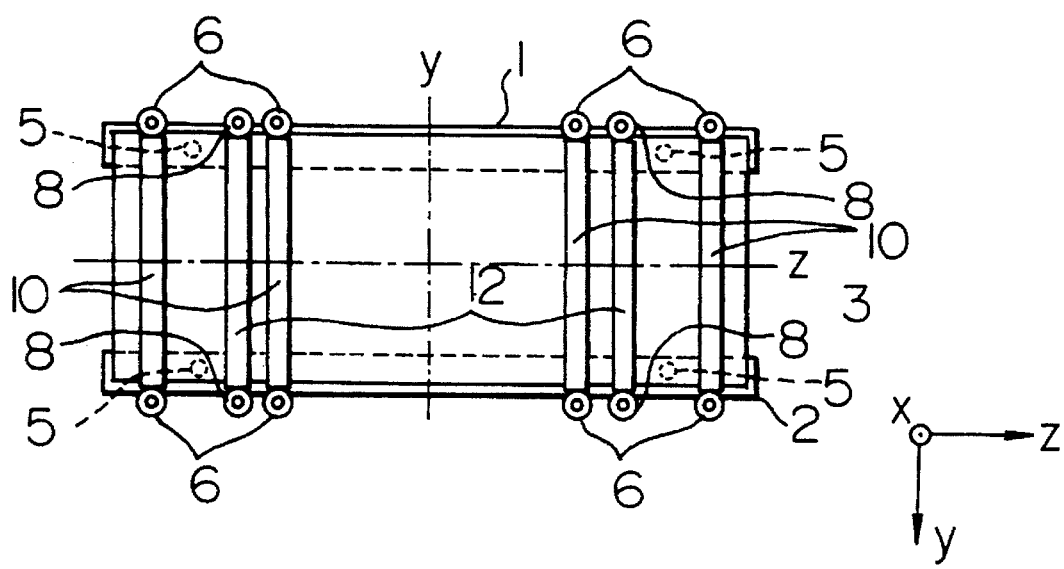

When the bobbin for supporting the gradient magnetic field coil comprises the separable bobbin having a changeable shape, wiring of the gradient magnetic field coil becomes a problem. In FIG. 2, reference numerals 10, 11 and 12 denote an X-directional gradient magnetic field coil, a Y-directional gradient magnetic field coil and a Z-directional gradient magnetic field coil, respectively. Terminals 6 and 8 are fitted to the end portion of the wire material of the X-directional gradient magnetic field coil and the z-directional gradient magnetic field coil that pass through at least two coil supporters among the supporters 1 to 4 constituting the separable bobbin, respectively. A connector or a solderless terminal is an example of such a terminal. A current for the gradient magnetic field can be caused to flow through each gradient magnetic field coil by connecting the terminal of the coil supporter of the corresponding gradient magnetic field coil. The wire material of the gradient magnetic field coil is separated for each coil supporter under the state where the terminals 6 and 8 are not connected. Therefore, a separable bobbin having a sectional shape which is variable in the X-direction can be accomplished. A separable bobbin having the shape which is variable in the Y-direction can also be accomplished by preparing a plurality of coil supporters having different distances d2 in the Y-direction between the supporting rods 5 fitted to the side surface parts 3, 4, and combining them with the upper part 1 and the bottom part 2.

Figure 3:
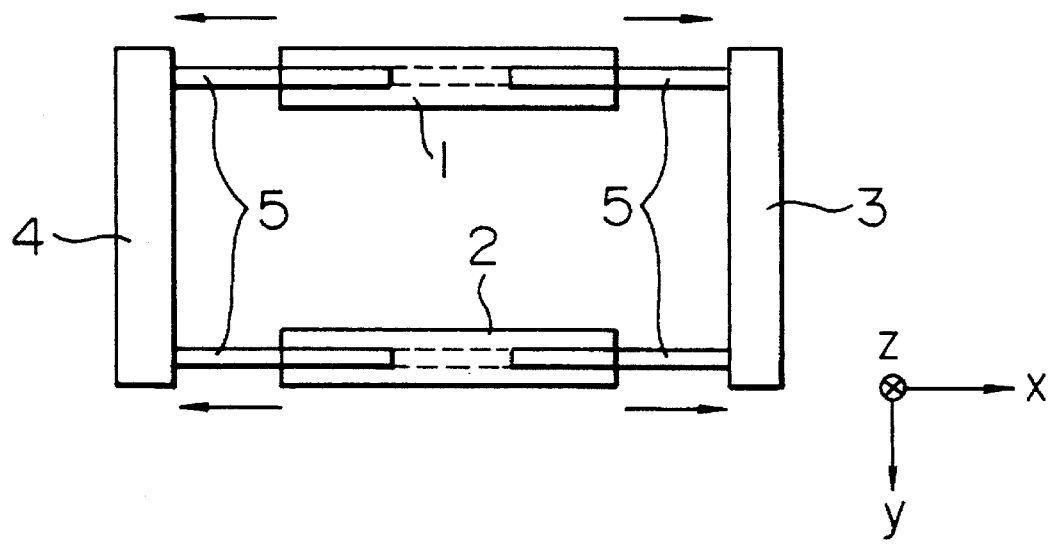
FIG. 3 is a sectional view of the separable bobbin according to the present invention.

To set the patient to the imaging apparatus when using such a separable bobbin, the terminals are first disconnected and the side surface parts 3, 4 are moved in the directions indicated by arrows in FIG. 3, respectively, so as to enlarge the entrace for the patient into the bobbin. After the patient is set to a predetermined position, the side surface parts 3, 4 are moved in the opposite directions to the above, and the gradient magnetic field coils are brought close to the patient and are connected by the terminals. As described above, the patient can make an easy access into the bobbin carrying the gradient magnetic field coils.

Figure 4:
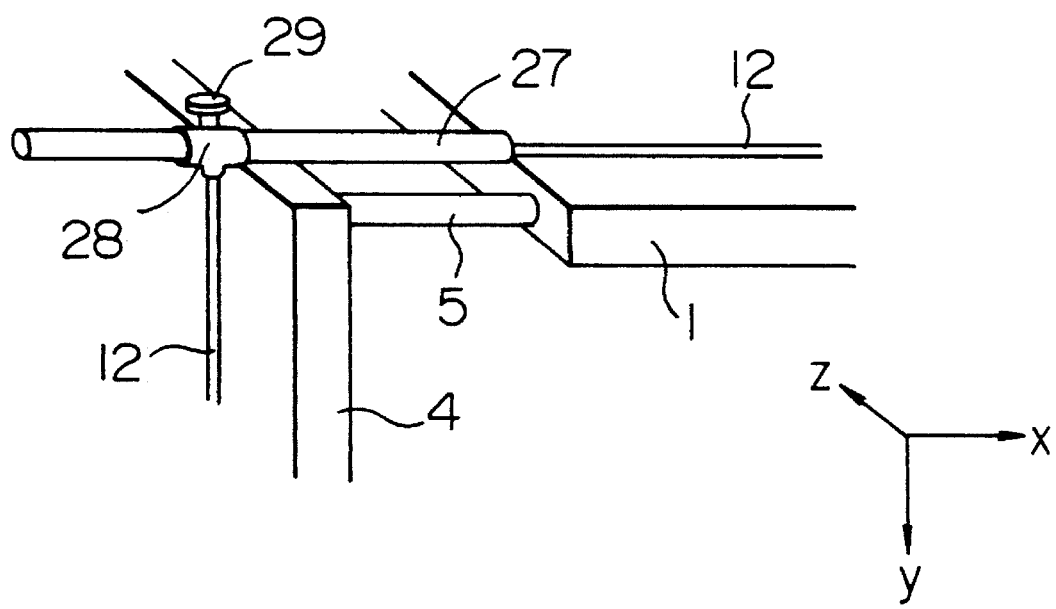
FIG. 4 is a schematic view showing the structure of the coil wire materials in the separable bobbin capable of adjusting its size in match with physical features of a patient according to the present invention.

In addition, the distance between the patient and the gradient magnetic field coils can be regulated in match with the physical features of the patient by the use of auxiliary components. When the solderless terminals are used as the terminals, for example, two solderless terminals are connected to each other by a conductor made of a nonmagnetic susbtance, and the distance between the patient and the gradient magnetic field coil can be regulated by adjusting the length of this nonmagnetic conductor. Alternatively, as shown in FIG. 4, the end portions of the wire materials of the gradient magnetic field coils of the upper part 1 and the bottom part 2 of the coil supporters constituting the separable bobbin are connected to a circular rod 27 made of a nonmagnetic electric conductive substance, for example. On the other hand, the end portions of the wire materials of the gradient magnetic field coils of the side surface parts 3, 4 of the coil supporter are connected to a nonmagnetic electric conductive substance which has, at least a part thereof, a hollow section greater than the radius of the circular rod 27. A screw 29 made of a nonmagnetic substance for fixing is fitted to the conductive substance 28, and the conductive substance 27 is fitted into the hollow portion of the conductive substance 28. After the screw 29 is loosened, the conductor substance 28 is moved along the side surface parts 3, 4 of the coil supporter with the conductive substance 27 being a support pole so as to bring the patient close to the gradient magnetic field coil. Thereafter, the screw 29 is fastened and the conductive substance 28 is fixed at a predetermined position on the conductive substance 27. In this manner, the distance between the gradient magnetic field coils and the patient can be regulated in the separable bobbin.

Figure 5:
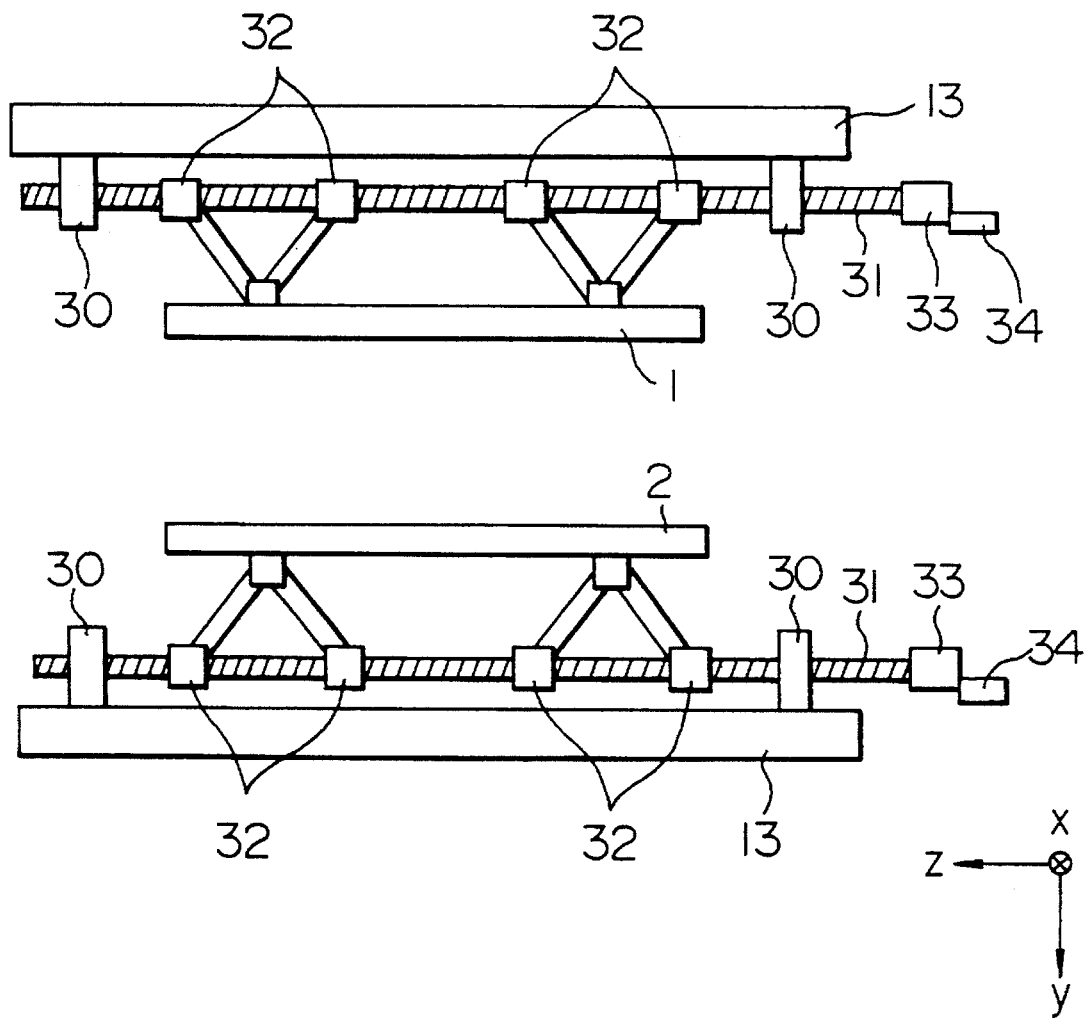
FIG. 5 is a schematic view showing the construction of an MRI imaging apparatus capable of taking an image without combining coil supporters with one another in the separable bobbin according to the present invention.
Figure 6:
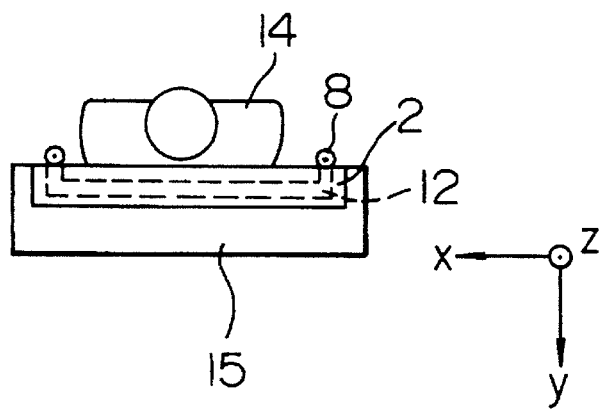
FIG. 6 is a sectional view sowing the state where a part of a coil set component constituting the separable coil set according to the prent invention is fixed to a bed.

The description given above represents the separable bobbin having variable size and shape by interconnecting the coil supporters 1, 2, 3, 4 constituting the separable bobbin by the supporting rods 5. In this connection, a method known in the field of coils for generating a radio-frequency magnetic field and for detecting a signal can be applied to the separable bobbin. In other words, it is the method that accomplishes the separable bobbin for supporting the gradient magnetic field coils without combining the coil supporters constituting the separable bobbin. FIG. 5 shows an example of such a method. A separable bobbin holding and regulating lever 31 (hereinafter merely called the "holding and regulating lever") is fitted the magnet 13 for the static magnetic field through suspension means 30. The holding and regulating lever 31 is equipped with a plurality of helical screws extending in mutually different directions, and guiding members 32 are fitted in such a manner as to form pairs with the corresponding screws, respectively. When the holding and regulating lever 31 is rotated clockwise, the guiding members 32 approach one another and when the former is rotated counter-clockwise, the guiding members 32 are spaced apart from one another. The holding and regulating lever 31 is rotated by a stepping motor 34 through a gear shift 33. The stepping motor 34 is controlled by a micro-processor, for example. The separable bobbin moves up and down in accordance with the distance between the guiding members 32, and its size and shape can be changed. The moving distance of the separable bobbin can be known from a gear ratio and the number of revolution of the stepping motor 34. Though the drawing illustrates only the example where the distance adjustment is carried out between the upper part 1 and the bottom part 2 of the coil supporter, the adjustment can be similarly carried out for the side surface parts 3, 4. By the way, the wire materials of the gradient magnetic field coils can be connected using the terminals, etc, in the same way as in FIG. 2.

The description given above explains the structure of the separable bobbin having the changeable size and shape, and the use of such a separable bobbin provides various other advantages. Next, the advantages other than those described above will be explained.

Figure 7:
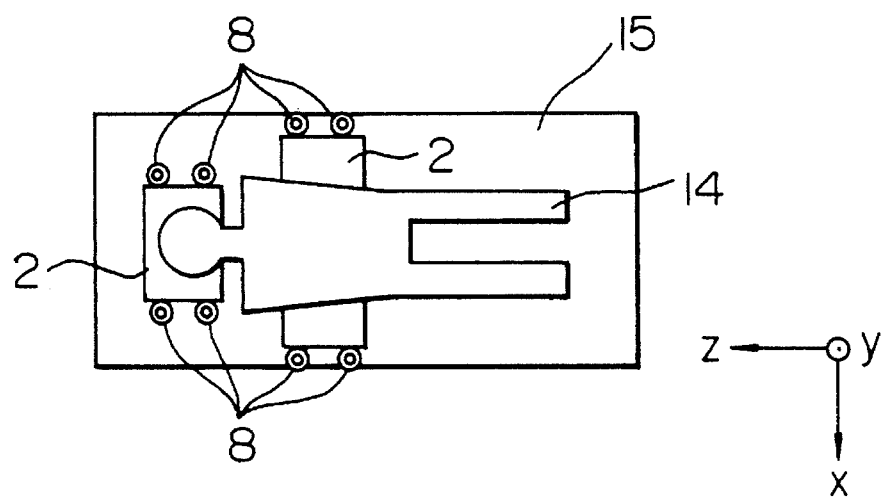
FIG. 7 is a plan view showing the state where two coil set components having mutually different sizes according to the present invention are fixed to the bed.

The separable gradient magnetic field coils are supported by the coil supporters to form a coil component and these coil components are combined to form the separable coil set. The use of such a separable coil set can eliminate the trouble of exchanging the coil set of the gradient magnetic field as a whole even for different imaging portions. In other words, a separable coil set having a suitable size for the imaging portion can be assembled by changing the combination of the coil set components that constitute the separable coil set, and using coil set components having different sizes. To speedily change the combination of the components, it is also possible to either fix, or bury, the bottom part 2 of the coil set component of the coil supporter supporting the separated gradient magnetic field coil, to or into the bed 15, and to integrate them together. In this case, the wire material of the gradient magnetic field coil at the bottom part 2 is preferably buried completely into the coil supporter constituting the separable bobbin in each a manner as to expose only the terminal 9 on the surface. If the wire material of the coil is buried into the coil supporter constituting the separable bobbin, vibration of the wire material can be reduced when a gradient magnetic field current is caused to flow, and influences of this vibratioan are not transmitted to the bed 15. The change of the components of the bottom part 2 becomes necessary when several bottom parts 2 having mutually different sizes are buried in advance into the bed 15 as shown in FIG. 7. Besides the reduction of the trouble of changing the components, this structure keeps the position of the patient unaltered on the bed and does not need resetting. Accordingly, a load to the patient can also be reduced.

Figure 8:
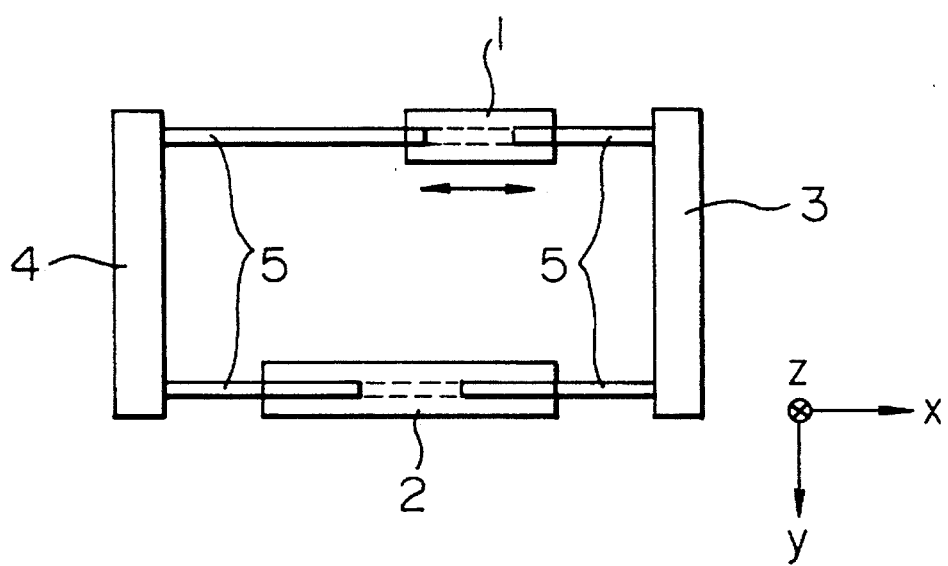
FIG. 8 is a sectional view showing the structure of a separable bobbin according to the present invention which has an asymmetric shape with respect to the center of a magnetic field.

The shape of the separable bobbin can be made asymmetric with respect to the center of the magnetic field by changing the length of the components of the upper and bottom parts 1, 2 of the coil supporters constituting the separable bobbin in the X-direction as shown in FIG. 8. Since the gradient magnetic field coils forming the pair are assymetric, a high gradient, uniform magnetic field can be generated locally. In the example shown in FIG. 8, the length of the upper part 1 in the transverse direction is shorter than the length of the bottom part 2 and has a margin in the transverse direction. In other words, the center position of the gradient magnetic field can be made variable by combining the coil supporters constituting the separable bobbin and having different lengths as a pair and rendering the shorter coil supporter movable.

Figure 9:
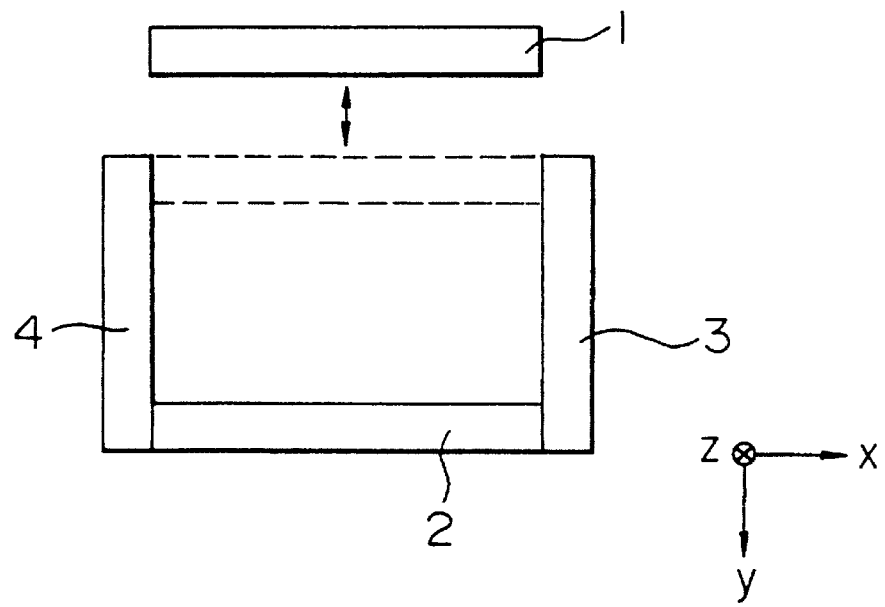
FIG. 9 is a sectional view showing an example where an upper part of a coil supporter constituting the separable coil according to the present invention is rendered removable.
Figure 10:
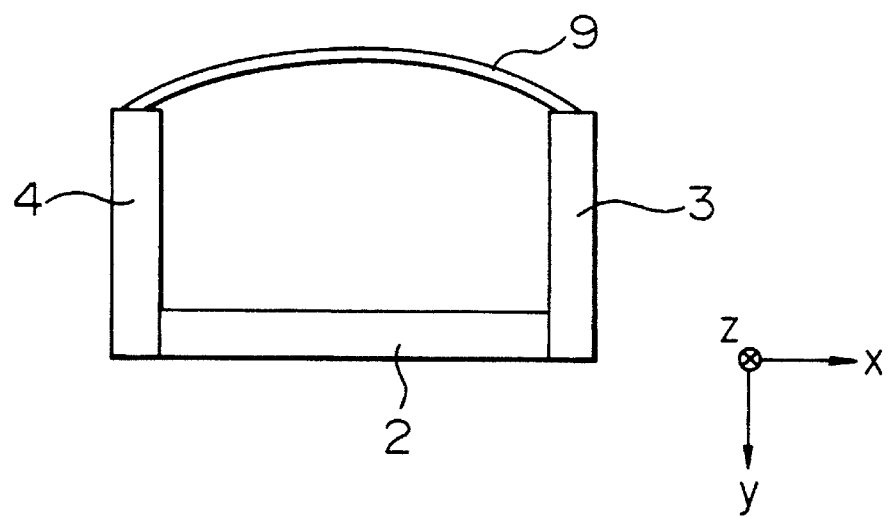
FIG. 10 is a sectional view showing an example where the separable bobbin according to the present invention is reinforced.

The separable bobbin can be used by reducing the number of coil supporters used for assembling it. For example, imaging is conducted while the upper part 1 of the coil supporter is removed as shown in FIG. 9. Since the upper part 1 is open., the patient can make an easier access into the separable bobbin and the advantages such as the reduction of the assembly time of the separabel bobbin, elimination of a sense of oppression to the patient, and so forth, can be obtained. Incidentally, the parts of the coil supporter other than the upper part, that is, the bottom part 2 and the side surface parts 3, 4, may be independent coil supporters or may be integrated with one another to form the coil supporter, in this case. Where the strength of the separable bobbin is not sufficient, a member 9 of reinforcement is used in place of the upper part 1 as shown in FIG. 10. This member 9 uses a nonmagnetic substance having similar properties to those of the nonmagnetic supporting rod 5, and preferred is a reinforcement method which expands the space at the upper part lest any sense of oppression is given to the patient. When a rod-like material is used as the member 9 for reinforcement, for example, the patient can make has access into the separable bobbin in substantially the same way as the case where no reinforcement exists. When a transparent material such as a sheet of an acrylic resin is used for the member 9 of reinforcement, the upper part 1 is kept removed when the patent is set to the imaging apparatus, and the separable bobbin is assembled using the member 9 of reinforcement in place of the upper part 1 set at a predetermined position. Though this example does not reduce the total number of components, it can reduce the sense of oppression to the patient.

When the gradient magnetic field generation unit includes a coil set having a fixed shape and a separate coil set having a changeable set, imaging can be effected using both of the coils in combination.

Where a strong gradient magnetic field is required only in the X-direction, for example, the separable coil set is brought close to the patient in the X-direction and is driven, while the coils sets having a fixed shape are driven in the Y- and Z-directions. When both types of the coils are used, the number of components to be assembled for the separable bobbin can be reduced and at the same time, the sense of oppression to the patient can be reduced.

Figure 11:
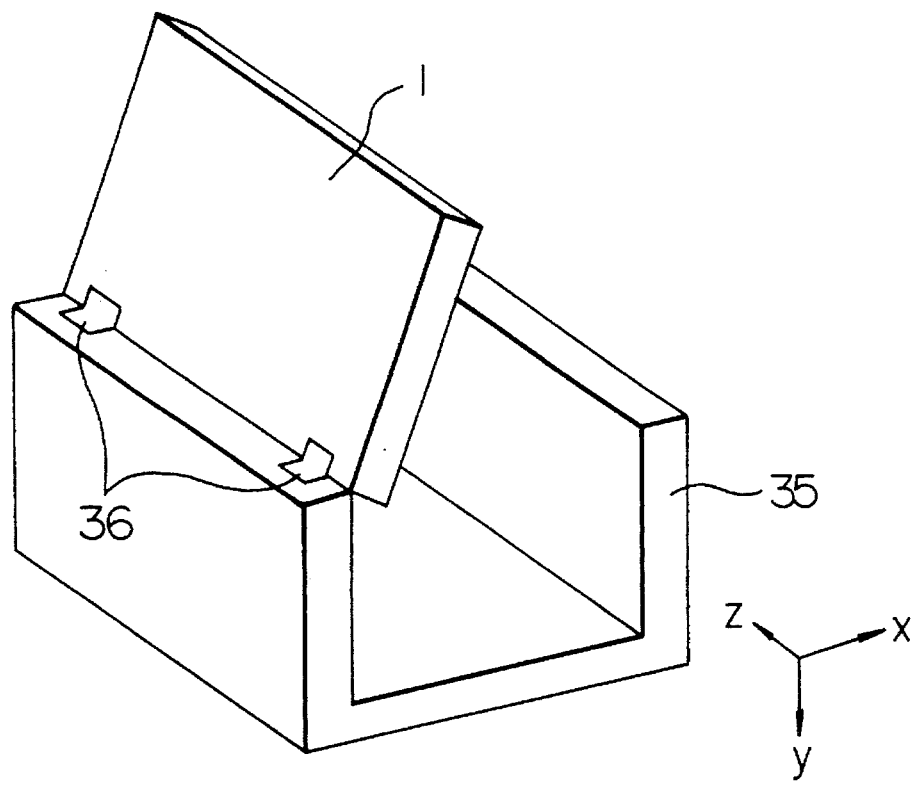
FIG. 11 is a schematic view showing the state where hinges are fitted to coupling portions of the separable bobbin according to the present invention.
Figure 12:
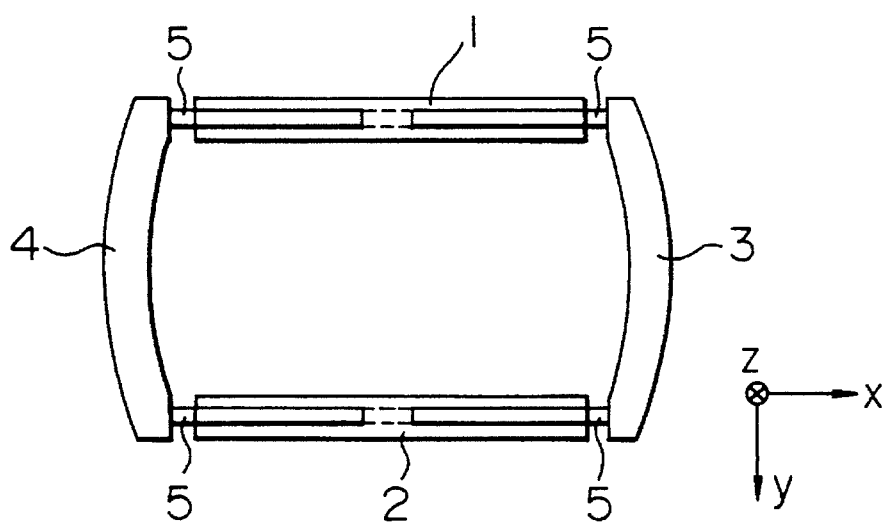
FIG. 12 is a sectional view showing a separable bobbin wherein a side surface portion of a coil supporter is curved.

As shown in FIG. 11, for example, hinges 35 made of a nonmagnetic substance are fitted to parts of the coil supporter as a unitary structure of the portions corresponding to the bottom part 2 and the side surface parts 3, 4 of the coil supporter shown in FIG. 1, and the upper part 1 is combined with this unitary coil supporter 35. In this case, the bobbin is separated if the hinges 36 are removed, when separation and assembly are not made once again. Therefore, the bobbin of this type is also embraced within the scope of the separable bobbin herein described. The section of the bobbin of the gradient magnetic field coil is not limited to the shape shown in FIG. 1. The section may be a circular cylinder or an ellipsoid, or a part of the separable bobbin may be curved. The supporting rods 5 made of a nonmagnetic substance represent the example of the combination which satisfies the essential regurirement that the parts 1, 2, 3, 4 must be firmly combined without exerting adverse influences on the imaging environment. The shape of the supporting rod is not limited to the rod-like shape, and the materials of the the supporting rod may be metals such as stainless steel, brass and aluminum, or non-metals such as reinforced plastics and ceramics so long as they can firmly combine the coil supporters.

If the gradient magnetic field coil set comprises the separable coil set having a changeable shape, there is the possibility that the imaging environment changes, so that the imaging condition must be changed. Next, a method of coping with such a condition will be explained.

Figure 13:
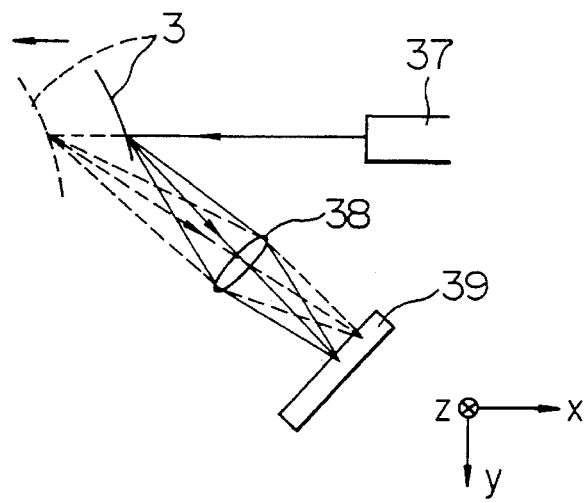
FIG. 13 is a schematic view useful for explaining the principle of a position detection method of a coil supporter using an optical beam according to the present invention.

First of all, the position of the coil supporter, that is, the distance of the coil supporter from a reference point such as the center of the magnetic field, must be measured. An optical beam is used for this purpose, for example. The principle of the method of detecting the position of the coil supporter using the optical beam is illustrated in FIG. 13. Thin parallel beams are irradiated to a measurement point on the surface (solid line) of the coil supporter 3 from an optical beam source 37, and scattering light spots occur on the surface of the coil supporter. The scattering beams are condensed by a lens 38 and an image is formed as a light spot on a semiconductor position-sensitive detection element 39. When the coil supporter 3 moves in the direction indicated by an arrow (the direction of the optical beam) and its surface reaches the position indicated by dash line, the position of the light spot on the semiconductor position-sensitive detection element 39 changes. This position change is detected as a current change, and the position of the coil supporter can be correctly grasped. The position of disposition of the optical beam source 37 is, for example, on the surface of the static magnetic field producing coil on the patient side, and as to the Z-directional gradient magnetic field, the center position of the magnetic field is suitable. The optical beam source 37 may be disposed outside the imaging apparatus. The number of the optical beam source 37 is at least one.

A simple method of detecting the position of the coil supporter can utilize the change of the resistance value of the gradient magnetic field coil. In FIG. 3, only the side surface parts 3, 4 of the coil supporter constituting the separable bobbin represent the change of the position. As the positions of the side surface parts 3, 4 change, the resistance value of the Z-directional gradient magnetic field coil changes, too. The distance between the side surface parts 3, 4 can be determined by using this resistance change value.

When the bobbin of the gradient magnetic field coil comprises the separable bobbin and its shape is changed, the intensity of the gradient magnetic field changes, too. Therefore, the gradient magnetic field intensity and the gradient magnetic field application time that are optimal for a given bobbin shape, the imaging condition such as a field of view, are determined in advance as the imaging condition, and are stored as a table in a memory. After the bobbin shape is detected in accordance with the procedures described above, the imaging condition is decided by referring to the table. A measuring instrument such as a search coil, for example, is disposed on the coil apparatus to measure the intensity of the magnetic field, and measurement is carried out experimentally under a reference imaging condition. The optimal imaging condition may be determined by utilizing this measurement result.

When imaging is carried out while the separable bobbin is kept asymmetric with respect to the center of the magnetic field or without using a part of the coil supporter constituting the separable bobbin, there is the possibility that an image distortion occurs due to non-linearity of the gradient magnetic field intensity. This problem can be solved by effecting correction on the basis of the distribution of the gradient magnetic field intensity when image processing is executed, as described in JP-A-63-19138.

As described above, the present invention can accomplish the separable bobbin having a changeable shape by dividing the bobbin of the gradient magnetic field coil into a plurality of coil supporters and assembling these coil supporters. Accordingly, the present invention can easily set the patient into the bobbin, and can easily fit and remove the bobbin holding the gradient magnetic field coil to and from the MRI imaging apparatus.

Since the distance between the patient and the gradient magnetic field can be reduced, the desired gradient magnetic field intensity can be accomplished by a smaller current producing the gradient magnetic field than the current required by the prior art. The center of the magnetic field can be moved by the subtle combination of the separable bobbins, and the trouble of fitting and removing the bobbin can be reduced by fixing a part of the gradient magnetic field to the bed. When the gradient magnetic field coil having a fixed shape and fixed to the imaging apparatus is available as the gradient field producing means, both type of coils are used in combination and only the separable coil in the direction, in which a higher gradient magnetic field intensity is required, may be set. This setting operation can be carried out with a smaller labor than the unseparable bobbin according to the prior art.

We claim:

1. A nuclear magnetic resonance imaging apparatus comprising:

static magnetic field generating means for generating a uniform static magnetic field in a first direction;

first gradient magnetic field generating means including a plurality of coils for generating a first gradient magnetic field in said first direction;

second gradient magnetic field generating means including a plurality of coils for generating a second gradient magnetic field in a second direction;

third gradient magnetic field generating means including a plurality of coils for generating a third gradient magnetic field in a third direction;

radio-frequency magnetic field generating means for generating a radio-frequency magnetic field;

signal detection means for detecting a nuclear magnetic resonance signal from an inspection object on a bed;

a computer for computing detections signals of said signal detection means; and output means for outputting a computation result of said computer;

wherein said first, second and third directions are orthogonal to each other, and at least one of said first, second and third gradient magnetic field generating means includes a first bobbin for holding at least one of the plurality of coils of said first, second and third gradient magnetic field generating means, said first bobbin comprising a plurality of separable bobbin segments, and said at least one of the plurality of coils of said first, second and third gradient magnetic field generating means comprises a plurality of separable coil segments, and at least one of the plurality of bobbin segments of said first bobbin holds at least one of the coil segments of said at least one of the plurality of coils of said first, second and third gradient magnetic field generating means.

2. A nuclear magnetic resonance imaging apparatus according to claim 1, wherein said first bobbin is assembled by combining the plurality of the bobbin segments of said first bobbin so that a shape of said first bobbin is asymmetric to a center of at least one of said first, second and third gradient magnetic fields.

3. A nuclear magnetic resonance imaging apparatus according to claim 1, further comprising at least one other coil and a second bobbin fixed to said static magnetic field generating means and said at least one other coil for generating gradient magnetic fields.

4. A nuclear magnetic resonance imaging apparatus according to claim 3, wherein at least one of the first, second and third gradient magnetic fields is generated by using individually said at least one of the plurality of coils of said first, second and third gradient magnetic field generating means being held by said first bobbin and said at least one other coil being held by the second bobbin.

5. A nuclear magnetic resonance imaging apparatus according to claim 3, wherein said at least one of the plurality of coils of said first, second and third gradient magnetic field generating means being held by said first bobbin is disposed closer to the inspection object than said at least one other coil being held by said second bobbin.

6. A nuclear magnetic resonance imaging apparatus according to claim 1, wherein said computation result is an image, and further comprising means for correcting distortion of said image, said distortion resulting from non-linearity of said first, second and third gradient magnetic fields.

7. A nuclear magnetic resonance imaging apparatus according to claim 1, wherein at least one of the bobbin segments of said first bobbin is made of a transparent material.

8. A nuclear magnetic resonance imaging apparatus according to claim 1, wherein at least one of the bobbin segments of said first bobbin opposing the bed is transparent.

9. A nuclear magnetic resonance imaging apparatus according to claim 1, wherein at least a part of said first bobbin opposing the bed is cut off so that said first bobbin has an opening.

10. A nuclear magnetic resonance imaging apparatus according to claim 1, further comprising detecting means for detecting a shape of one of the bobbin segments of said first bobbin, and determining means for determining an imaging condition of the inspection object.

11. A nuclear magnetic resonance imaging apparatus according to claim 1, wherein at least one of the coil segments being held by the at least one of the segments of said first bobbin is fixed to the bed.

12. A nuclear magnetic resonance imaging apparatus comprising:

static magnetic field generating means for generating a uniform static magnetic field;

gradient magnetic field generating means including a plurality of coils for generating gradient magnetic fields in each of a first, second and third directions being orthogonal to each other, said gradient magnetic field generating means further including a first bobbin for holding at least one of the plurality of coils for generating gradient magnetic fields in at least one of the first, second and third direction, said first bobbin comprising a plurality of separable bobbin segments;

radio-frequency magnetic field generating means for generating a radio-frequency magnetic field;

changing means for changing a location of at least one of the bobbin segments of said first bobbin; and signal detection means for detecting a nuclear magnetic resonance signal from an inspection object on a bed;

wherein at least one of the plurality of coils for generating at least one of the first, second and third gradient magnetic fields comprises a plurality of separable coil segments, and at least one of a plurality of the bobbin segments of said first bobbin holds at least one of the coil segments of said at least one of the plurality of coils.

13. A nuclear magnetic resonance imaging apparatus according to claim 12, further comprising a plurality of other coils, and a second bobbin fixed to said static magnetic field generating means and said plurality of other coils for generating gradient magnetic fields.

* * * * *